(12) United States Patent
Munoz Rojas et al.

(10) Patent No.: US 10,847,502 B2
(45) Date of Patent: Nov. 24, 2020

(54) OPTOELECTRONIC DEVICE AND METHOD OF MANUFACTURING SAME

(71) Applicants: Centre National de la Recherche Scientifique, Paris (FR); Institut Polytechnique de Grenoble, Grenoble (FR)

(72) Inventors: David Munoz Rojas, Meylan (FR); Maria del Carmen Jimenez Arevalo, Grenoble (FR); Daniel Bellet, Poisat (FR); Stéphane Brochen, Grenoble (FR)

(73) Assignees: CENTRE NATIONAL DE LA RECHERCHE SCIENTIFIQUE, Paris (FR); INSTITUT POLYTECHNIQUE DE GRENOBLE, Grenoble (FR)

( * ) Notice: Subject to any disclaimer, the term of this patent is extended or adjusted under 35 U.S.C. 154(b) by 191 days.

(21) Appl. No.: 16/320,263

(22) PCT Filed: Jul. 21, 2017

(86) PCT No.: PCT/FR2017/052008
§ 371 (c)(1),
(2) Date: Jan. 24, 2019

(87) PCT Pub. No.: WO2018/020113
PCT Pub. Date: Feb. 1, 2018

(65) Prior Publication Data
US 2019/0259740 A1 Aug. 22, 2019

(30) Foreign Application Priority Data
Jul. 26, 2016 (FR) ...................................... 16 57159

(51) Int. Cl.
*H01L 25/16* (2006.01)
*H01L 51/42* (2006.01)
(Continued)

(52) U.S. Cl.
CPC ...... *H01L 25/167* (2013.01); *H01L 31/03926* (2013.01); *H01L 31/047* (2014.12);
(Continued)

(58) Field of Classification Search
CPC . H01L 25/167; H01L 51/0096; H01L 31/047; H01L 31/18; H01L 31/03926;
(Continued)

(56) References Cited

U.S. PATENT DOCUMENTS 8,378,371 B2 * 2/2013 Illek ...................... H01L 33/145
257/99
8,835,937 B2 * 9/2014 Wirth .............. H01L 31/022408
257/79
(Continued)

OTHER PUBLICATIONS

International Search Report and Written Opinion for PCT Patent App. No. PCT/FR2017/052008 (dated Oct. 25, 2017) with English translation of the ISR.

*Primary Examiner* — Seung C Sohn
(74) *Attorney, Agent, or Firm* — Kenealy Vaidya LLP

(57) ABSTRACT

Some embodiments are directed to an optoelectronic device for converting an electrical signal into electromagnetic radiation or vice-versa, including an active zone sandwiched between first and second electrodes, the optoelectronic device having a stack of layers with a lateral edge and first and second opposite faces, the layers of the stack forming at least the active zone and the first and second electrodes, the stack being intended to receive or emit the electromagnetic radiation through the lateral edge perpendicularly to the direction of stacking of the layers.

19 Claims, 5 Drawing Sheets

(51) Int. Cl.
    *H01L 31/0392*     (2006.01)
    *H01L 51/44*       (2006.01)
    *H01L 51/00*       (2006.01)
    *H01L 31/047*      (2014.01)
    *H01L 31/18*       (2006.01)

(52) U.S. Cl.
    CPC .......... *H01L 31/18* (2013.01); *H01L 51/0096* (2013.01); *H01L 51/424* (2013.01); *H01L 51/441* (2013.01); *H01L 51/448* (2013.01); *H01L 2251/533* (2013.01); *Y02E 10/549* (2013.01)

(58) Field of Classification Search
    CPC ... H01L 51/424; H01L 51/441; H01L 51/448; H01L 2251/533; Y02E 10/549; Y02P 70/50
    See application file for complete search history.

(56) References Cited

U.S. PATENT DOCUMENTS

| | | |
|---|---|---|
| 2012/0055537 A1 | 3/2012 | Liao |
| 2013/0146119 A1 | 6/2013 | Jin et al. |
| 2013/0157402 A1 | 6/2013 | Jin et al. |
| 2013/0160819 A1 | 6/2013 | Li et al. |
| 2013/0298980 A1 | 11/2013 | Fogel et al. |

* cited by examiner

OPTOELECTRONIC DEVICE AND METHOD OF MANUFACTURING SAME

CROSS REFERENCE TO RELATED APPLICATIONS

This application is a national phase filing under 35 C.F.R. § 371 of and claims priority to International Patent Application No. PCT/FR2017/052008, filed on Jul. 21, 2017, which claims the priority benefit under 35 U.S.C. § 119 of French Application No. 1657159, filed on Jul. 26, 2016, the contents of which are hereby incorporated in their entireties by reference.

BACKGROUND

Some embodiments relate to an optoelectronic device and a method for manufacturing such a device.

Optoelectronic devices are devices suitable for converting an electrical signal into electromagnetic radiation or vice-versa, and in particular devices dedicated to the detection, measurement or emission of electromagnetic radiation or devices dedicated to photovoltaic applications.

Producing an optoelectronic device by a stack of substantially planar layers is known.

FIG. 1 shows, partially and schematically, an optoelectronic device 10 including, from bottom to top:

a substrate 12, an electrically conductive layer 14 forming a bottom electrode, an active zone 16 in which the majority of the electromagnetic radiation/electrical signal conversion is carried out and including for example a stack of a semiconductive layer 18 doped with a first type of conductivity, for example n-type doping, and a semiconducting layer 20 doped with a second type of conductivity, for example p-type doping, and an electrically conductive layer 22 forming a top electrode.

For photovoltaic applications and applications for detecting or measuring electromagnetic radiation, the face 24 of the electrode 22 opposite to the active zone 16 is arranged so as to receive electromagnetic radiation, for example visible light, represented by an arrow 26 in FIG. 1. The electromagnetic radiation is absorbed in the active zone 16 and causes the creation of charge carriers, electrons and holes, which are collected by the electrodes 14, 22. For applications relating to the emission of electromagnetic radiation, charge carriers conducted by the electrodes 14, 22 are converted in the active zone 16 into electromagnetic radiation, which escapes from the device 10 through the face 24.

Designing the optoelectronic device 10 may be difficult. This is because, for photovoltaic applications and applications for the detection or measurement of electromagnetic radiation, the electromagnetic radiation 26 passes through the layers forming the device 10 parallel to the direction E of stacking of these layers. It would therefore be desirable to increase the thickness of the active zone 16 in order to increase the proportion of the electromagnetic radiation 26 that is absorbed in passing through the active zone 16. However, it may be necessary for the charge carriers, electrons and holes, which are created in the active zone 16, to pass through the active zone 16 globally in a direction parallel to the direction E of stacking in order to reach one of the electrodes 14, 22. It would then be desirable to reduce the thickness of the active zone 16 in order to reduce the quantity of charge carriers that recombine in the active zone 16 before reaching one of the electrodes 14, 22. The two constraints described above are opposed and, in the design of the optoelectronic device 10, a compromise may be found between good absorption of the electromagnetic radiation in the active zone 16 and good collection of the charge carriers, and this depends on the material making up the active zone.

Another drawback common to photovoltaic applications, applications for the detection or measurement of electromagnetic radiation and applications for emission of electromagnetic radiation is that the electromagnetic radiation 26 may pass through the electrode 22 in order to reach the active zone 16 or the face 24. The electrode 22 may therefore be at least partially transparent to the electromagnetic radiation 26 while ensuring the conduction of the charge carriers created in the active zone 16. However, it is not possible to produce the electrode 22 in a way that is perfectly transparent so that losses by absorption of part of the light by the electrode 22 are observed.

The patent application US 2012/0055537 describes a photovoltaic panel in which alveoli are formed in the substrate covered with the stack including the active zone sandwiched between the conductive layers in order to increase the reflection of the incident light, the light nevertheless reaching the active zone by passing through one of the conductive layers.

SUMMARY

One aspect of one embodiment aims to overcome all or some of the drawbacks of the optoelectronic devices described above.

Another aspect of one embodiment is that the electrodes of the optoelectronic device are not transparent to the electromagnetic radiation emitted or captured by the optoelectronic device.

Another aspect of one embodiment is to increase the proportion of the electromagnetic radiation that is absorbed in passing through the active zone of the optoelectronic device.

Another aspect of one embodiment is to shorten the travel of the charge carriers between the electrodes and the core of the active zone of the optoelectronic device.

Thus one embodiment provides an optoelectronic device for converting an electrical signal into electromagnetic radiation or vice-versa, including an active zone sandwiched between the first and second electrodes, the optoelectronic device including a stack of layers including a lateral edge and first and second opposite faces, the layers of the stack forming at least the active zone and the first and second electrodes, the stack being intended to receive or emit the electromagnetic radiation through the lateral edge.

According to one embodiment, the direction of propagation of the electromagnetic radiation in the active zone is perpendicular to the direction of stacking of the layers.

According to one embodiment, the stack includes a first portion delimiting a first part of the first face and a first part of the second face and a second portion delimiting a second part of the first face and a second part of the second face, the first part of the first face being in contact with the second part of the first face or the second part of the second face.

According to one embodiment, the stack includes a succession of folds.

According to one embodiment, the folds are in a concertina shape.

According to one embodiment, each fold includes successively a first flap in which the layers of the stack are planar, an angled zone in which the layers of the stack are curved and a second flap in which the layers of the stack are planar, the second flap of one of the folds corresponding to the first flap of the following fold in the succession of folds, the angled zones being oriented alternately on each side of the optoelectronic device.

According to one embodiment, the device further includes a first electrically conductive plate in contact with the first electrode for the first folds among the folds and a second electrically conductive plate in contact with the second electrode for the second folds among the folds different from the first folds.

According to one embodiment, the device further includes an electrically insulating substrate, the second electrode being sandwiched between the active zone and the substrate, the substrate including openings exposing the second electrode.

According to one embodiment, the second plate is in contact with the second electrode through the openings.

According to one embodiment, the stack is wound in a spiral shape.

According to one embodiment, the optoelectronic device includes a first electrically conductive element at the centre of the spiral and in contact with the first electrode and a second electrically conductive element at the periphery of the spiral and in contact with the second electrode.

According to one embodiment, the stack includes an electrically insulating substrate, the second electrode being interposed between the electrically insulating substrate and the active zone. According to one embodiment, the thickness of the active zone is between 0.1 µm and 100 µm.

According to one embodiment, the active zone is the zone where the majority of the conversion occurs between the electromagnetic radiation and the electrical signal.

Another embodiment provides a method for manufacturing an optoelectronic device for converting an electrical signal into electromagnetic radiation or vice-versa, the optoelectronic device including an active zone sandwiched between the first and second electrodes, the method including the formation of a stack of layers including a lateral edge and first and second opposite faces, the layers of the stack forming at least the active zone and the first and second electrodes, the stack being intended to receive or emit the electromagnetic radiation through the lateral edge.

According to one embodiment, including the formation of the stack including a first portion delimiting a first part of the first face and a first part of the second face and a second portion delimiting a second part of the first face and a second part of the second face, the first part of the first face being in contact with the second part of the first face or the second part of the second face.

According to one embodiment, the method includes the following steps:
forming the stack, the layers of the stack being planar to within 10%; and
folding the stack in order to form the folds.

According to one embodiment, the method includes the following steps: providing a substrate;
forming grooves in the substrate; and
depositing the layers of the stack on the grooved substrate.

According to one embodiment, the method includes the following steps:
forming the stack, the layers of the stack being planar to within 10%; and
winding the stack in order to form a spiral.

BRIEF DESCRIPTION OF THE FIGURES

These features and advantages, as well as others, will be disclosed in detail in the following description of particular embodiments given non-limitatively in relation to the accompanying figures, among which.

DETAILED DESCRIPTION OF EXEMPLARY EMBODIMENTS

The same elements have been designated by the same references in the various figures and, in addition, the various figures are not drawn to scale. For reasons of clarity, only the elements that are useful to an understanding of the embodiments described have been depicted and are detailed. In particular, the control circuits of the optoelectronic devices, especially the circuits for processing the current supplied by photovoltaic cells and the circuits for processing signals supplied by an electromagnetic-radiation detection device, or the circuits supplying an electromagnetic-radiation emission device, are well known to persons skilled in the art and are not described hereinafter.

Figure 2:
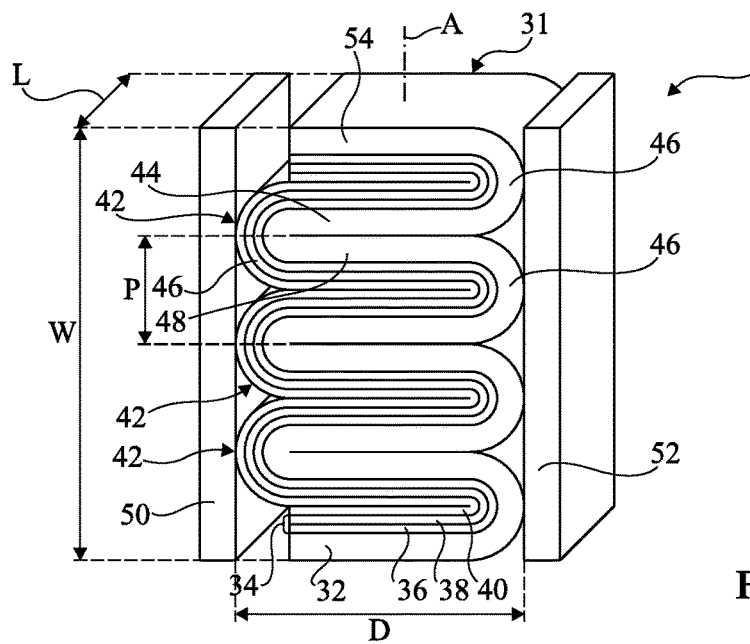
FIGS. 2 and 3 are partial schematic views in perspective with cross-section of embodiments of an optoelectronic device.

In the following description, when reference is made to relative-position qualifiers, such as the terms "upper" and "lower", reference is being made to the orientation of the figures or to an optoelectronic device in a normal position of use. Unless stated to the contrary, the expressions "approximately", "substantially" and "of the order of" mean to within 10%, possibly to within 5%. FIG. 2 shows an embodiment of an optoelectronic device 30.

The optoelectronic device 30 includes a stack 31 of a plurality of layers.

The stack 31 includes:
a substrate 32,
an active zone 34 in which the majority of the conversion of electromagnetic radiation to electrical signal is carried out and including for example the stack of a semiconductive layer 36 doped with a first type of conductivity, for example n-type doped, and a semiconducting layer 38 doped with a second type of conductivity, for example p-type doped, and an electrically conductive layer 40 forming an electrode, the active zone 34 being sandwiched between the substrate 32 and the electrode 40.

Interface layers, not shown, may be provided between the active zone 34 and the substrate 32 and/or between the active zone 34 and the electrode layer 40.

The stack 31 has a concertina structure including a succession of concertina folds 42, also referred to as Z folds, extending in a direction A of succession of folds. Each fold 42 includes successively a first flap 44, in which the layers of the stack 31 are substantially planar, an angled zone 46 in which the layers of the stack are curved, and a second flap 48 in which the layers of the stack 31 are substantially planar. The second flap 48 of one fold corresponds to the first flap 44 of the following fold. The angled zones 46 are situated alternately on either side of the concertina structure. Possibly, the folds 42 are contiguous, that is to say two successive folds 42 are in contact with one another.

The optoelectronic device 30 includes two electrically conductive plates 50, 52. In the present embodiment, the two plates 50, 52 are substantially parallel. The stack 31 is sandwiched between the two plates 50, 52, the angled zones 46 being in contact with the plates 50 and 52. In particular, the plate 50 is in contact with the electrode 40 at the angled zones 46 of the stack 31 oriented on the same side as the plate 50, and the plate 52 is in contact with the substrate 32 at the angled zones 46 of the stack 31 oriented on the same side as the plate 52. The angled zones 46 are alternately oriented on the same side as the plate 50 and on the same side as the plate 52.

The stack 31 includes a lateral edge 54 that is defined by the lateral edges of the layers of the stack 31 disposed on the same side. According to one embodiment, the face 54 is substantially planar and perpendicular to the plates 50, 52.

The minimum distance between the two plates 50, 52 is termed the width D. The dimension of the stack 31 measured in the direction A of succession of folds is termed the length W. The dimension of the stack 31 measured in a direction perpendicular with respect to the directions of measurement of the dimensions D and W is termed the depth L. In addition, the period of the folds measured parallel to the dimension W is termed P.

The length W may be between a few millimetres and a few metres, for example between 1 mm and 10 m. The length W has no influence on the functioning of optoelectronic device 30.

Figure 3:
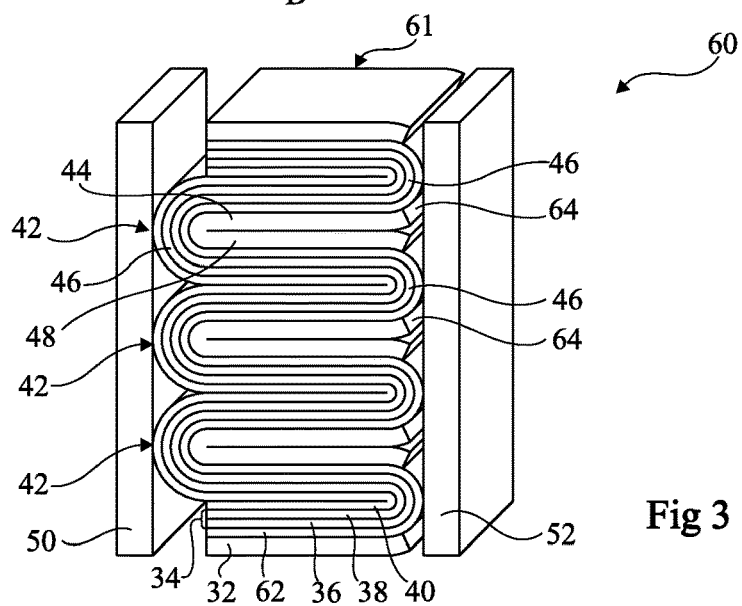

FIG. 3 shows an embodiment of an optoelectronic device 60. The optoelectronic device 60 includes the set of elements of the optoelectronic device 30 shown in FIG. 2 except that the stack 31 is replaced by a stack 61 that is differentiated from the stack 31 through the following points:

the stack 61 includes an electrically conductive layer 62, forming an electrode, interposed between the substrate 32 and the active zone 34;

the substrate 32 includes through openings 64 at the angled zones 46 of the stack 31 situated on the same side as the plate 52, the electrode layer 62 being in contact with the plate 52 through each opening 64.

The substrate 32 has a thickness that may be greater than 1 µm, possibly between 1 µm and 800 µm, or even possibly between 1 µm and 100 µm. The substrate 32 is flexible, that is to say it can, under the action of an external force, deform, in particular fold, without breaking or tearing.

For the optoelectronic device 30, the substrate 32 is electrically conductive and then fulfils the role of an electrode. The substrate 32 may be metallic. The substrate 32 may be conductive composite polymer or conductive plastics material.

For the optoelectronic device 60, the substrate 32 is electrically insulating. The substrate 32 is, for example, made from polymer. Examples of polymer are polyethylene naphthalene (PEN), polyethylene terephthalate (PET), Kapton or polyetheretherketone (PEEK).

The electrode layer 40 may be made from a conductive oxide, carbon nanotubes, graphene, a conductive polymer, in particular including a lattice of nanotubes or nanowires, a metal or a mixture of or an alloy of at least two of these compounds. By way of example, the electrode layer 40 may include conductive nanowires or conductive nanoparticles, for example silver nanowires.

Examples of conductive oxides suitable for producing the electrode layer 40 are indium-tin oxide (ITO), fluorine doped tin oxide (FTO), aluminium-zinc oxide (AZO) and gallium-zinc oxide (GZO). Examples of conductive polymers suitable for producing the electrode layer 40 are polyaniline, also referred to as PAni, and the polymer known by the name PEDOT:PSS, which is a mixture of poly(3,4)-ethylenedioxythiophene and sodium polystyrene sulfonate. Examples of metals suitable for producing the electrode layer 40 are silver (Ag), gold (Au), copper (Cu), nickel (Ni), titanium (Ti) and chromium (Cr). An example of a multi-layer structure suitable for producing the electrode layer 40 is a multilayer structure of AZO and silver of the AZO/Ag/AZO type. By way of example, the electrode layer 40 has a thickness of between 5 nm and 2 µm. According to one embodiment, the electrode layer 40 is not transparent to the radiation emitted or captured by the optoelectronic device 30 or 60.

The electrode layer 62 may have the same composition and the same thickness as the electrode layer 40 or have a different structure.

The active zone 34 has a thickness that corresponds to the minimum distance separating the substrate 32 from the electrode 40. The thickness may be between 0.05 µm and 100 µm. The active zone 34 may be based on organic materials, semiconductor materials, in particular amorphous silicon or crystalline silicon, or materials of the $Cu_2O$ type.

The active zone 34 may include small molecules, oligomers or polymers. They may be organic or inorganic materials. The active zone 34 may include an ambipolar semiconductor material, or a mixture of an n-type semiconductor material or a p-type semiconductor material, for example in the form of superimposed layers or an intimate mixture to the nanometric scale so as to form a volume heterojunction.

Examples of p-type semiconductor polymers suitable for producing the active zone 34 are poly(3-hexylthiophene) (P3HT), poly[N-9'-heptadecanyl-2,7-carbazole-alt-5,5-(4,7-di-2-thienyl-2',1',3'-benzothiadiazole] (PCDTBT), poly[(4,8-bis-(2-ethylhexyloxy)-benzo[1,2-b;4,5-b']dithiophene)-2,6-diyl-alt-(4-(2-ethylhexanoyl)-thieno[3,4-b]thiophene))-2,6-diyl];4,5-b']dithi-ophene)-2,6-diyl-alt-(5,5'-bis(2-thienyl)-4,4,-dinonyl-2,2'-bithiazole)-5',5"-diyl] (PBDTTT-C), poly[2-methoxy-5-(2-ethyl-hexyloxy)-1,4-phenylene-vinylene] (MEH-PPV) or poly[2,6-(4,4-bis-(2-ethylhexyl)-4H-cyclopenta[2,1-b;3,4-b']dithiophene)-alt-4,7(2,1,3-benzothiadiazole)] (PCPDTBT).

Examples of n-type semiconductor materials suitable for producing the active zone 34 are fullerenes, in particular C60, methyl [6,6]-phenyl-C61-butanoate ([60]PCBM), methyl [6,6]-phenyl-C71-butanoate ([70]PCBM), perylene diimide, zinc oxide (ZnO) or nanocrystals allowing the formation of quantum dots.

In the case where the active zone 34 is a heterojunction, the optoelectronic device 30, 60 may further include an additional layer between the active zone 34 and the electrode 32 and/or the electrode 40, which plays for example the role of an electron- or hole-blocking layer.

Figure 4:
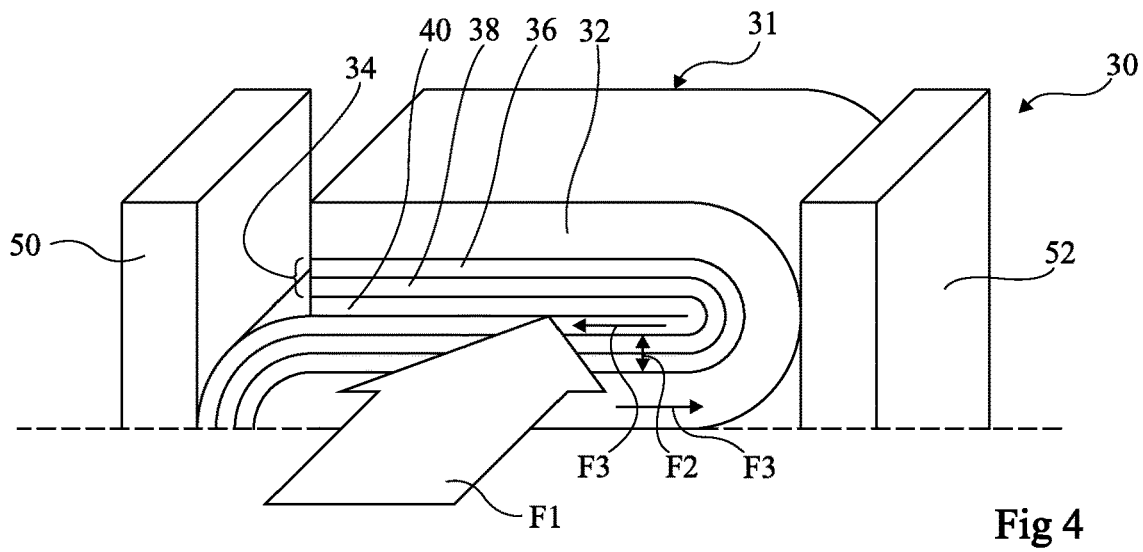
FIG. 4 is a detail view of FIG. 2 illustrating the operating principle of an application of the optoelectronic device.

FIG. 4 illustrates the functioning of the optoelectronic device 30. The functioning of the optoelectronic device 60 is identical to the functioning of the optoelectronic device 30 except that the role of transport of charge carriers played by the substrate 32 for the device 30 is played by the electrode layer 62 for the device 60.

The optoelectronic device 30 is intended to receive or emit electromagnetic radiation through the lateral edge 54. In FIG. 4, the direction of propagation of the electromagnetic radiation in the case where the optoelectronic device 30 converts electromagnetic radiation into an electrical signal is shown by an arrow F1. The direction F1 is perpendicular to the direction of stacking of the layers of the stack 31 at any point on the stack 31. The absorption of the radiation in the active zone 34 causes the generation of excess electrons and holes in the active zone 34, which move to the electrodes 32, 40 in the case of the device 30 and to the electrodes 40, 62 in the case of the device 60. In FIG. 4, the overall direction of propagation of the charge carriers created in the active zone 34 is shown by arrows F2. In the present embodiment, the directions F1 and F2 are substantially perpendicular. With the optoelectronic device 10 shown in FIG. 1, the direction of propagation of the charge carriers in the active zone 34 is coincident with the direction of propagation of electromagnetic radiation in the active zone 34. Conversely, in the present embodiment, the direction of propagation of the charge carriers in the active zone 34 is different from the direction of propagation of electromagnetic radiation in the active zone 34. There is therefore uncoupling between the direction of propagation of the charge carriers in the active zone 34 and the direction of propagation of electromagnetic radiation in the active zone 34. Because of this, the thickness of the active zone 34, which is to be taken into account for the propagation of the charge carriers in the active zone 34, can be chosen independently of the depth L of the stack 31, which is to be taken into account for the propagation of the electromagnetic radiation in the active zone 34. On the contrary, for the optoelectronic device 10 shown in FIG. 1, the thickness of the active zone 16 of the device 10 results from a compromise between a sufficient thickness for sufficiently absorbing the electromagnetic radiation but not too great to prevent the loss of charge carriers. This compromise does not need to be made for the device 30 or 60.

In FIG. 4, the direction of propagation of the charge carriers in the electrodes 32, 40 are also shown by arrows F3. The width D depends in particular on the ability of the electrode layers 32 and 40 for the device 30 and the electrode layers 40, 62 for the device 60 to transport the charge carriers between the active zone 34 and the plates 50, 52. The width D may vary from 1 mm to 10 m, for example from a few millimetres to a few metres.

In the case where the optoelectronic device 30 or 60 is intended to emit electromagnetic radiation, the direction of propagation of the electromagnetic radiation is opposite to that of the arrow F1, the direction of propagation of the charge carriers in the active zone 34 is opposite to the direction F2 and the direction of propagation of the charge carriers in the electrodes 32, 40 is opposite to the arrow F3. Advantageously, the electrodes 32, 40 are made from a material that is reflective for the electromagnetic radiation created in the active zone 34 in order to focus the emission of the electromagnetic radiation in the same direction.

The depth L depends on the nature of the materials making up the active zone 34. In the case where the optoelectronic device 30 converts electromagnetic radiation into an electrical signal, the depth L may possibly be sufficient to allow the substantially complete absorption of the electromagnetic radiation of interest in the active zone 34. According to one embodiment, the material making up the electrodes 32, 40 are materials that diffuse the electromagnetic radiation of interest, which advantageously makes it possible to increase the path travelled by the electromagnetic radiation in the active zone 34 and to decrease the depth L. The depth L may vary from 1 μm to 10 cm, for example from a few micrometres to a few centimetres.

The value of P depends in particular on the thickness of the substrate 32. The dimension P is substantially equal to the sum of twice the thickness of the substrate 32, twice the thickness of the active zone 34 and twice the thickness of the electrode layer 40.

Advantageously, when a crack appears in the electrode 40 or in the active zone 34, in particular at one of the angled zones 46, this does not interfere with the functioning of the optoelectronic device. This is because the flow of the charge carriers can then take place through the contact zone between one of the adjacent folds and the plate 50.

Figure 5A:
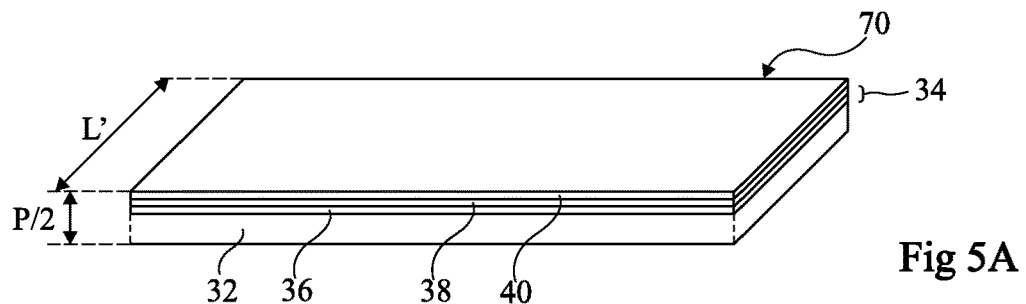
FIGS. 5A to 5C are partial schematic views in perspective with cross-section of structures obtained at successive steps of an embodiment of a method for manufacturing the optoelectronic device of FIG. 2.
Figures 5B, 5C:
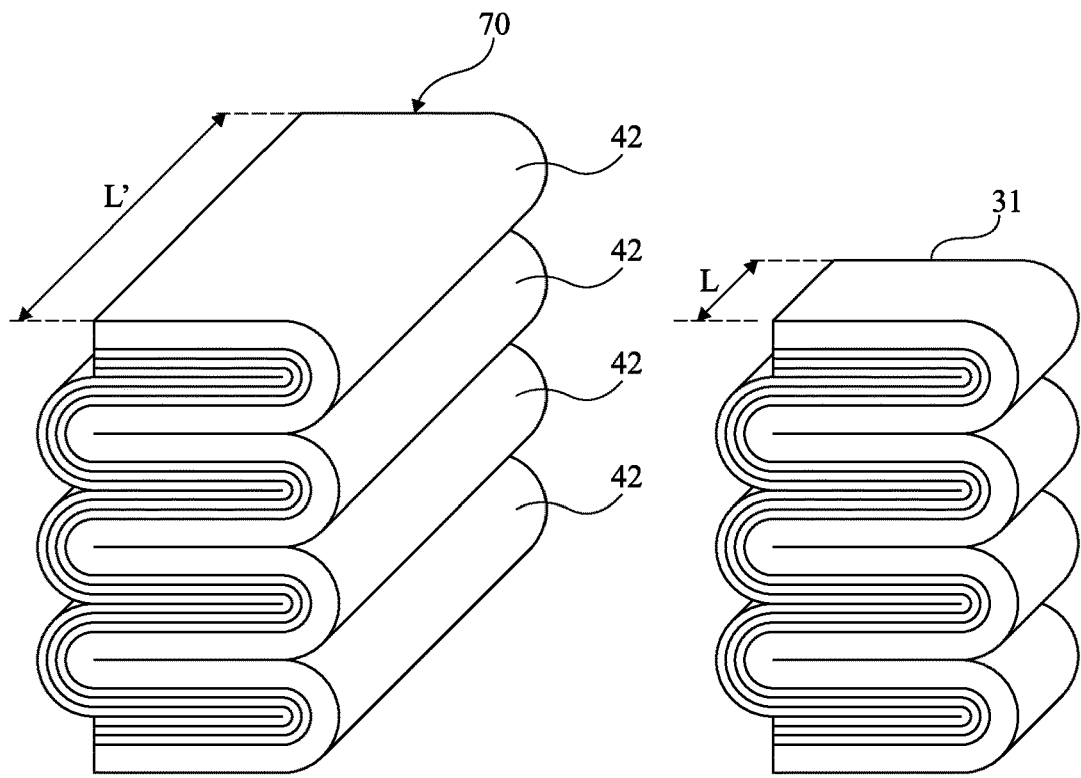

FIGS. 5A to 5C illustrate an embodiment of a method for manufacturing the optoelectronic device 30 shown in FIG. 2.

FIG. 5A shows the structure obtained after the production of a stack 70 of planar layers intended to form the layers of the stack 31 and designated by the same references. The stack 70 therefore includes the same succession of layers as the stack 31 except that the layers of the stack 70 are substantially planar and the stack 70 has a dimension L' strictly greater than the depth L of the optoelectronic device 30.

The thickness of the stack corresponds substantially to half the dimension P described previously. Depending on the materials making up the layers of the stack 70, the layers making up the stack 70 may be deposited for example by liquid method, cathodic sputtering, evaporation, spinner deposition, coating by spraying, heliography, slot-die coating, blade coating, flexography, screen printing, chemical vapour deposition (CVD), atomic layer deposition (ALD), spatial ALD and spray pyrolysis. Depending on the deposition method used, a step of drying the deposited materials may be provided.

FIG. 5B shows the structure obtained after the concertina folding of the stack 70. The active zone 34 may include the most mechanically fragile materials. In this case, the stack 70 shown in FIG. 5A is designed so that the active zone 34 is advantageously situated at the neutral-fibre plane. This makes it possible to reduce any mechanical stresses that may appear in the active zone 34 during the folding operation. Adhesive may be disposed on the free faces of the substrate 32 and of the electrode layer 40 in order to hold the folds 42 in position after the folding operation.

FIG. 5C shows the structure obtained after the cutting of the concertina structure shown in figure SB in order to obtain the stack 31 having a depth L.

The method includes at least one subsequent step of positioning of the conductive plates 50 and 52 on either size of the stack 31. By way of variant, conductive plates may be placed on either size of the stack 70 shown in figure SB before the cutting operation and be cut simultaneously with the stack 70.

Figure 6A:
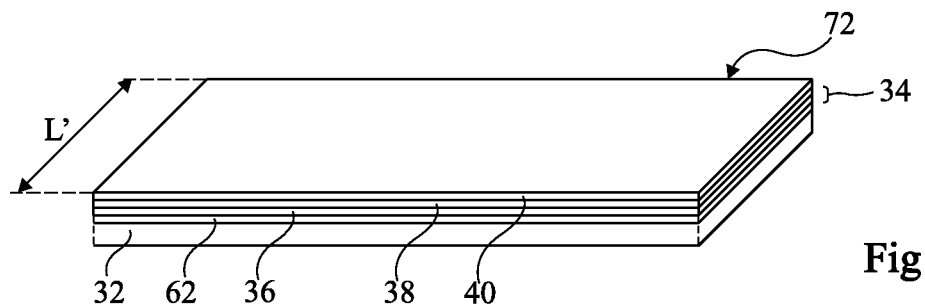
FIGS. 6A to 6C are partial schematic views in perspective with cross-section of structures obtained at successive steps of an embodiment of a method for manufacturing the optoelectronic device of FIG. 3.
Figure 6B:
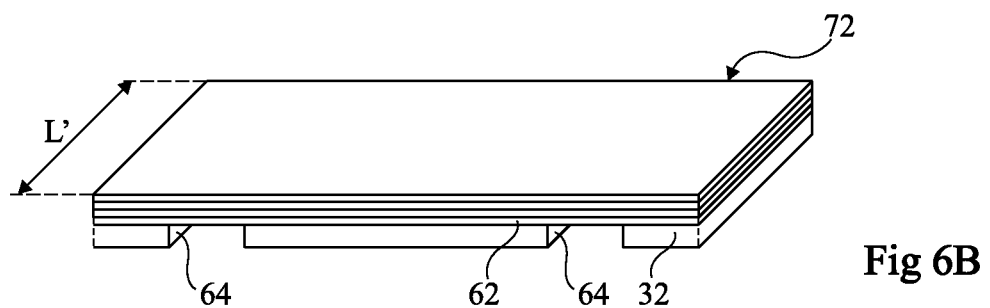
Figure 6C:
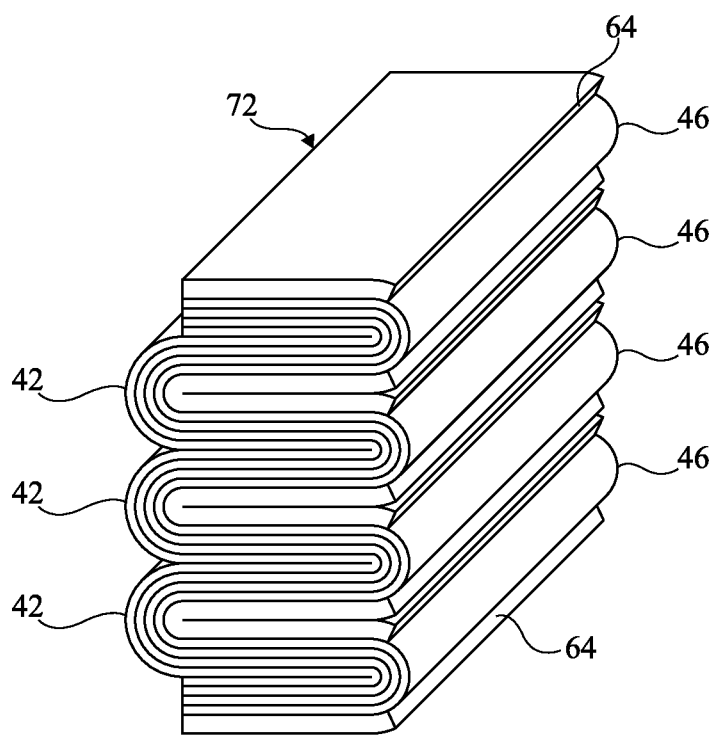

FIGS. 6A to 6C illustrate an embodiment of a method for manufacturing the optoelectronic device 60 shown in FIG. 3.

FIG. 6A is a figure similar to FIG. 5A and shows the structure obtained after the production of a stack 72 of planar layers intended to form the layers of the stack 61 and designated by the same references. The stack 72 therefore includes the same succession of layers as the stack 61 except that the layers in the stack 70 are substantially planar and the stack 72 has a dimension L' strictly greater than the depth L of the optoelectronic device 60.

FIG. 6B shows the structure obtained after the formation of the openings 64 in the substrate 32 over the whole of the thickness of the substrate 32 in order to expose portions of the electrode layer 62. According to one embodiment, each opening 64 extends over the whole of the depth L' of the stack 72. Two adjacent openings 64 are spaced apart by approximately twice the dimension D.

FIG. 6C shows the structure obtained after the concertina folding of the stack 72, so that the openings 64 are, after the folding, situated at the level of angled portions 46 of the concertina structure.

The method includes subsequent steps of cutting the concertina structure shown in FIG. 6C in order to obtain the stack 61 having a depth L and the placing of the conductive plates 50 and 52.

FIGS. 7A to 7D illustrate another embodiment of a method for manufacturing the optoelectronic device 30 shown in FIG. 2.

Figure 7A:
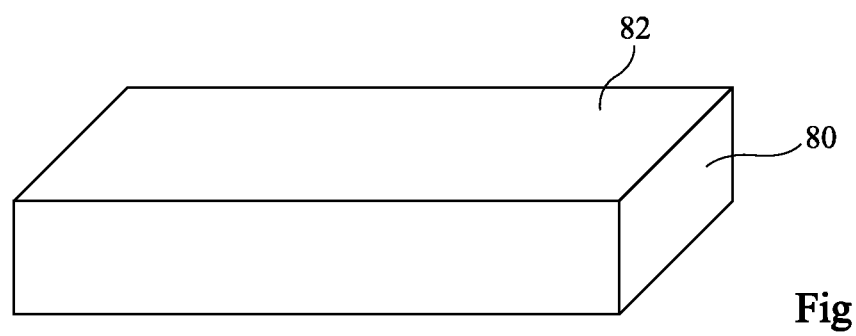
FIGS. 7A to 7D are partial schematic views in perspective with cross-section of structures obtained at successive steps of an embodiment of a method for manufacturing the optoelectronic device of FIG. 2.

FIG. 7A shows a substrate 80, made from an electrically conductive or semiconductive material, including a top face 82.

Figure 7B:
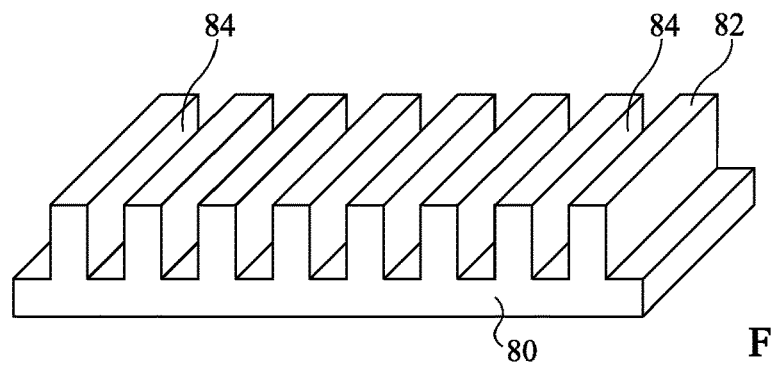

FIG. 7B shows the structure obtained after the formation of openings 84, also referred to as trenches, in the substrate 80 as from the top face 82. The openings 84 extend over part of the thickness of the substrate 80. In the present embodiment, the openings 84 are parallel grooves.

Figure 7C:
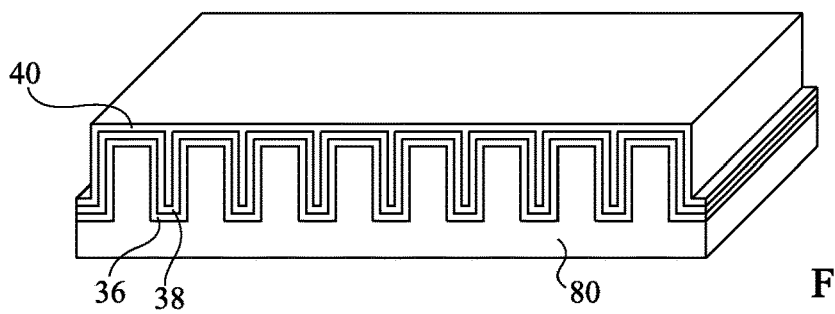

FIG. 7C shows the structure obtained after the deposition, on the structure shown in FIG. 7B, of the layers 36, 38 forming the active zone 34 and of the electrode layer 40. Depending on the nature of the materials forming the layers 36, 38, 40, these may be deposited for example, by cathodic sputtering, evaporation, spray coating, CVD, ALD, spatial ALD and spray pyrolysis. Depending on the deposition method used, a step of drying the deposited materials may be provided.

Figure 7D:
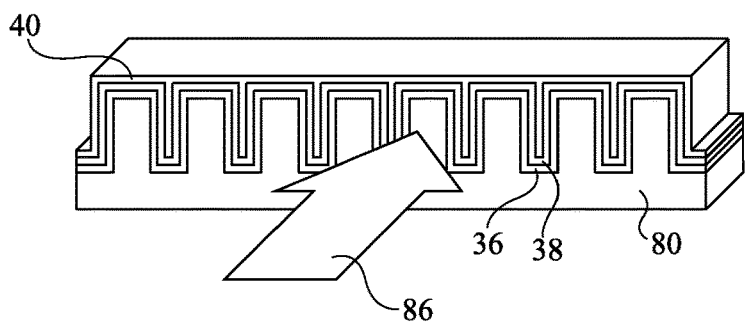

FIG. 7D shows the structure obtained after cutting of the structure shown in FIG. 7C. A concertina structure is then obtained. The method may include subsequent steps of placing the conductive plates 50 and 52.

In FIG. 7D, an arrow 86 shows the direction of propagation of electromagnetic radiation reaching the concertina structure when the optoelectronic device is used for photovoltaic applications and applications for detecting or measuring electromagnetic radiation.

The optoelectronic device 30 or 60 may be disposed on a support depending on the application envisaged. The support is for example a glass or plastic support, flexible or rigid. The optoelectronic device may be arranged on a non-planar surface.

Several copies of the optoelectronic device may be disposed alongside each other on the same face of a support. Each optoelectronic device may then form a pixel of a display system or of a measuring system.

Figure 8:
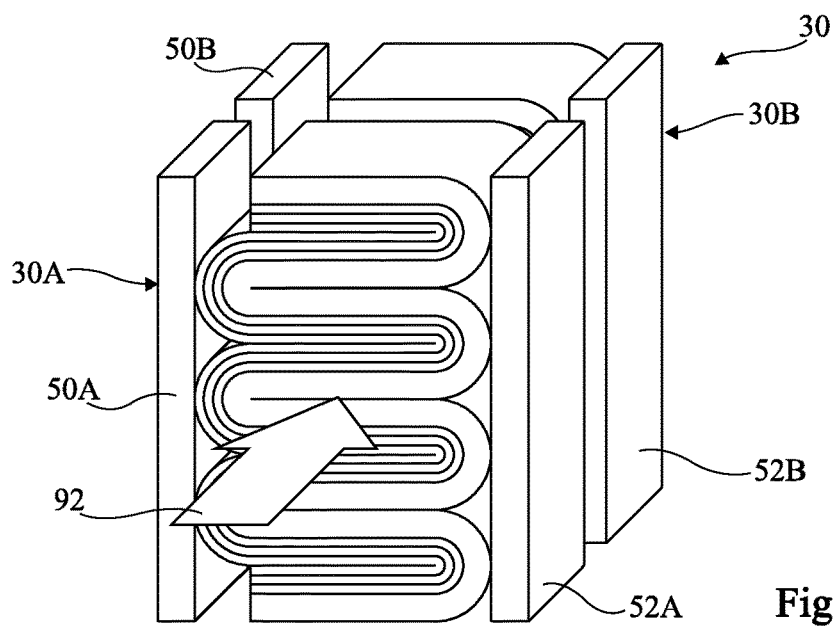
FIG. 8 is a partial schematic perspective view with cross-section of an embodiment of an optoelectronic system including two optoelectronic devices according to FIG. 2.

FIG. 8 shows an embodiment of an optoelectronic system 90 having a so-called tandem structure suited to photovoltaic applications and to applications for detecting or measuring electromagnetic radiation. The optoelectronic system 90 includes two copies of the optoelectronic device 30 shown in FIG. 2. The suffixes "A" and "B" are added to the references of the device 30 shown in FIG. 2 in order to differentiate the two optoelectronic devices 30A and 30B of the optoelectronic system 90. By way of variant, the optoelectronic system 30 may include two examples of the optoelectronic device 60 shown in FIG. 3. The two optoelectronic devices 30A and 30B are arranged one behind the other in the direction of propagation of electromagnetic radiation of interest, represented by the arrow 92, that is to say the optoelectronic device 30A, referred to as the front optoelectronic device, has the electromagnetic radiation 92 passing through it first, and the optoelectronic device 30B, referred as the rear optoelectronic device, receives the radiation that has already passed through the front optoelectronic device 30A. According to one embodiment, the range of wavelengths of the electromagnetic radiation absorbed by the active zone of the rear optoelectronic device 30B is at least partly different from the range of wavelengths of the radiation absorbed by the active zone of the front optoelectronic device 30A. Because of this, part of the electromagnetic radiation 92 reaching the optoelectronic system 90 is absorbed by the active zone of the front optoelectronic device 30A and all or part of the electromagnetic radiation that has not been absorbed by the front optoelectronic device 30A is absorbed by the active zone of the rear optoelectronic device 30B. The plates 50A, 52A of the front optoelectronic device 30A may be connected to the plates 50B, 52B of the rear optoelectronic device 30B so that the two optoelectronic devices 30A, 30B are connected in series or in parallel.

Figure 1:
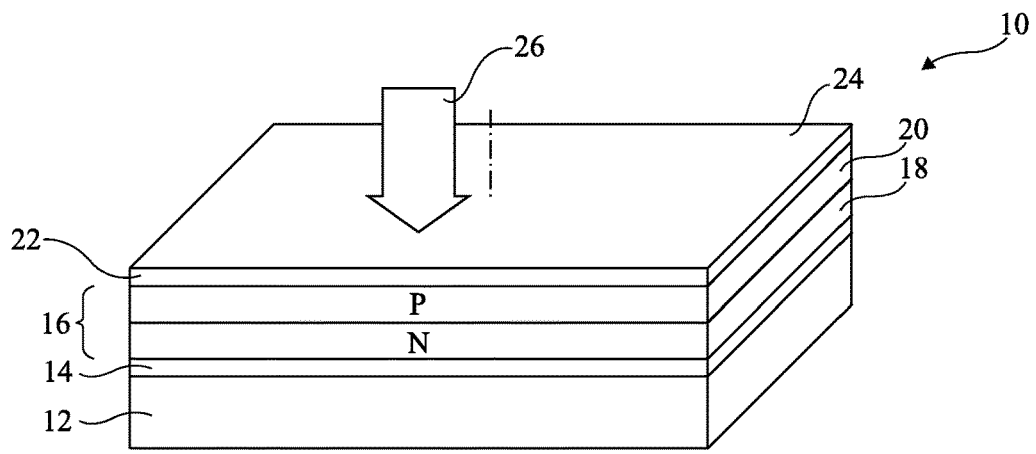
FIG. 1, described previously, is a partial schematic view in perspective with cross-section, of an example of a conventional optoelectronic device.

When a tandem optoelectronic system is produced with the optoelectronic device 10 shown in FIG. 1, it may be necessary for the layers making up the front optoelectronic device to allow the electromagnetic radiation to pass before being absorbed by the rear optoelectronic device. This may be obtained using for example an electrode structure including conductive fingers spaced apart or by choosing materials transparent to the electromagnetic radiation that is to be absorbed by the rear optoelectronic device. Designing the front optoelectronic device may then be difficult. This problem is not present with the optoelectronic system 90. Furthermore, when a tandem optoelectronic system is produced with the optoelectronic device 10 shown in FIG. 1, the optoelectronic system is generally formed by a stack of layers so that the front and rear optoelectronic devices are connected in series. The current passing through the optoelectronic system is then imposed by the highest series resistance among the front optoelectronic device or the rear optoelectronic device. This problem is not present with the optoelectronic system 90, in which the electrical connection between the optoelectronic devices 30A, 30B can simply be connected in parallel.

According to another embodiment, it can also be envisaged obtaining a device similar to the optoelectronic system 90 but firstly with a plurality of layers rather than just two, but also making provision for depositing on a substrate separate bands (and therefore electrically insulated from one another) of layers such as the layers 36, 38, 40. This makes it possible to design a device similar to the optoelectronic system 90 but with more devices stacked in the direction 92 without having cutting steps.

Figure 9:
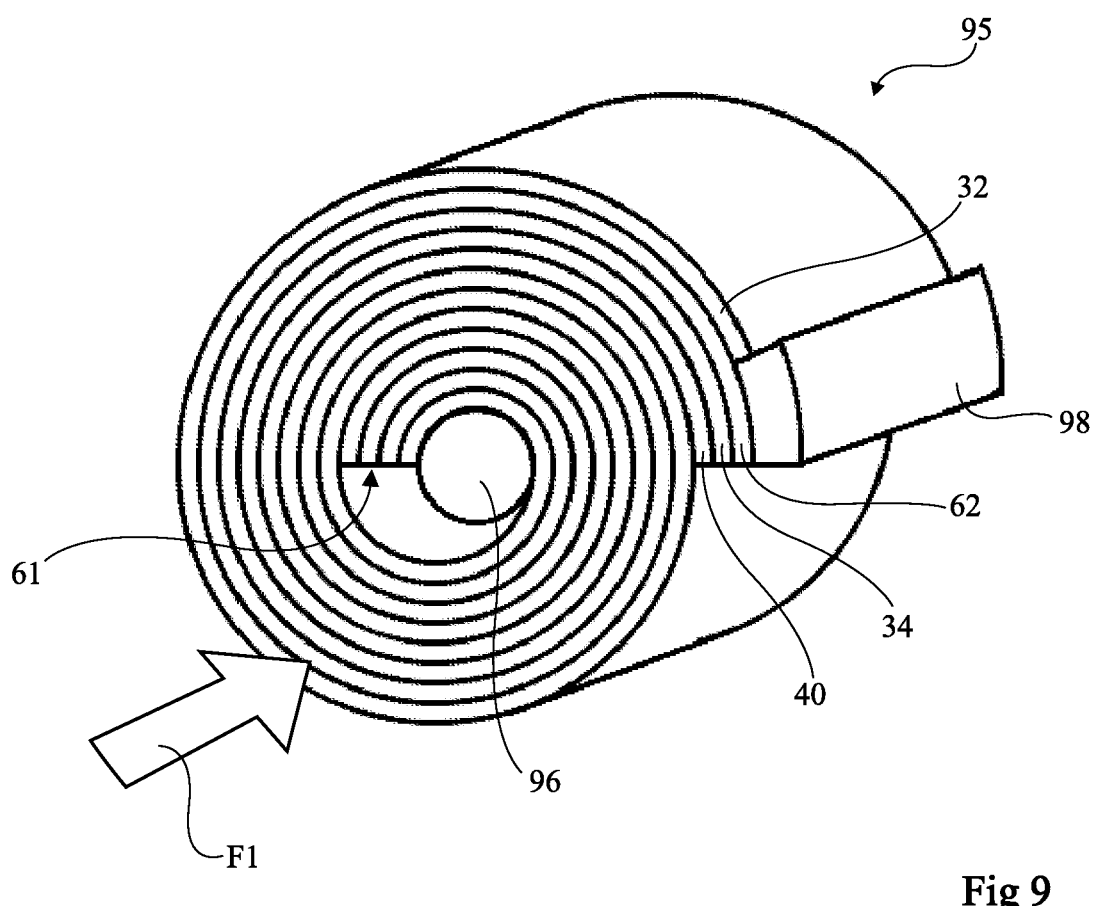
FIG. 9 is a partial schematic view in perspective of another embodiment of an optoelectronic device.

FIG. 9 is a perspective, partial and schematic view of an optoelectronic device 95. The optoelectronic device 95 includes the same stack 61 as that of the optoelectronic device 60 shown in FIG. 3 except that the stack 61 is not formed with folds 42 but is wound in order to form a spiral. According to one embodiment, the optoelectronic device 95 includes an electrically conductive cylindrical element 96 around which the stack 61 is wound, the conductive layer 40 of the stack 61 being in contact with the cylindrical element 96. The optoelectronic device 95 further includes an electrically conductive element 98 in contact with the conductive layer 62 at the periphery of the winding. In the winding, for first and second portions stacked radially in the spiral, the first portion being closer to the centre of the spiral than the second portion, the substrate 32 of the first portion is interposed between the conductive layer 62 of the first portion and the conductive layer 40 of the second portion and in contact with the conductive layer 62 of the first portion and the conductive layer 40 of the second portion.

By way of variant, the conductive cylindrical element 96 may not be present. In this case, the winding may be produced around a central cylindrical element that is next removed, and contact with the conductive layer 40 is achieved at the centre of the winding.

According to one embodiment, the central cylindrical element may further play the role of a light guide or a light-reflecting mirror.

The optoelectronic device 95 is intended to receive or emit electromagnetic radiation through the lateral edge of the stack 61. In FIG. 9, the arrow F1 represents the direction of propagation of the electromagnetic radiation in the case where the optoelectronic device 95 converts electromagnetic radiation into an electrical signal.

Various embodiments with various variants have been described above. It should be noted that a person skilled in the art can combine various elements of these various embodiments and variants without demonstrating any inventive skill. In particular, the optoelectronic system shown in FIG. 8 may be implemented with the optoelectronic device 95 shown in FIG. 9.

The invention claimed is:

1. An optoelectronic device for converting an electrical signal into electromagnetic radiation or vice-versa, comprising:
    an active zone sandwiched between first and second electrodes; and
    a stack of layers having a lateral edge and first and second opposite faces,
    wherein the layers of the stack forming at least the active zone and the first and second electrodes, and
    wherein the stack being intended to receive or emit the electromagnetic radiation through the lateral edge perpendicularly to the direction of stacking of the layers.

2. The optoelectronic device according to claim 1, wherein the direction of propagation of the electromagnetic radiation in the active zone is perpendicular to the direction of stacking of the layers.

3. The optoelectronic device according to claim 1, wherein the stack includes a first portion delimiting a first part of the first face and a first part of the second face and a second portion delimiting a second part of the first face and a second part of the second face, the first part of the first face being in contact with the second part of the first face or the second part of the second face.

4. The optoelectronic device according to claim 1, wherein the stack includes a succession of folds.

5. The optoelectronic device according to claim 4, wherein the folds are in a concertina shape.

6. The optoelectronic device according to claim 5, wherein each fold includes successively a first flap in which the layers of the stack are planar, an angled zone in which the layers of the stack are curved and a second flap in which the layers of the stack are planar, the second flap of one of the folds corresponding to the first flap of the following fold in the succession of folds, the angled zones being oriented alternately on each side of the optoelectronic device.

7. The optoelectronic device according to claim 4, further comprising a first electrically conductive plate in contact with the first electrode for first folds among the folds and a second electrically conductive plate in contact with the second electrode for second folds among the folds different from the first folds.

8. The optoelectronic device according to claim 1, further comprising an electrically insulating substrate, the second electrode being sandwiched between the active zone and the substrate, the substrate having openings exposing the second electrode.

9. The optoelectronic device according to claim 8, wherein the second plate is in contact with the second electrode through openings (64).

10. The optoelectronic device according to claim 1, wherein the stack is wound in the form of a spiral.

11. The optoelectronic device according to claim 10, further comprising a first electrically conductive element at the central of the spiral and in contact with the first electrode and a second electrically conductive element at the periphery of the spiral and in contact with the second electrode.

12. The optoelectronic device according to claim 10, wherein the stack includes an electrically insulating substrate, the second electrode being interposed between the electrically insulating substrate and the active zone.

13. The optoelectronic device according to claim 1, wherein the thickness of the active zone is between 0.1 µm and 100 µm.

14. The optoelectronic device according to claim 1, wherein the active zone is the zone where the majority of the conversion between the electromagnetic radiation and the electrical signal occurs.

15. A method for manufacturing an optoelectronic device for converting an electrical signal into electromagnetic radiation or vice-versa, the optoelectronic device including an active zone sandwiched between first and second electrodes, the method comprising:
    forming a stack of layers including a lateral edge and first and second opposite faces, the layers of the stack forming at least the active zone and the first and second electrodes, the stack being intended to receive or emit the electromagnetic radiation through the lateral edge.

16. The method according to claim 15, wherein forming the stack includes forming a first portion delimiting a first part of the first face and a first part of the second face and a second portion delimiting a second part of the first face and a second part of the second face, the first part of the first face being in contact with the second part of the first face or the second part of the second face.

17. The method according to claim 15, further comprising:
    forming the layers of the stack to be planar to within 10%; and
    folding the stack in order to form folds.

18. The method according to claim 15, further comprising:
    providing a substrate;
    forming grooves in the substrate; and
    depositing layers of the stack on the grooved substrate.

19. The method according claim 15, further comprising:
    forming the layers of the stack to be planar to within 10%; and
    winding the stack in order to form a spiral.

* * * * *